(12) United States Patent
Miyachi et al.

(10) Patent No.: US 6,985,208 B2
(45) Date of Patent: Jan. 10, 2006

(54) APPARATUS AND METHOD FOR RETAINING MIRROR, AND MIRROR EXCHANGE METHOD

(75) Inventors: Takeshi Miyachi, Tochigi (JP); Akira Miyake, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 73 days.

(21) Appl. No.: 10/661,870

(22) Filed: Sep. 11, 2003

(65) Prior Publication Data

US 2005/0057827 A1    Mar. 17, 2005

(30) Foreign Application Priority Data

Sep. 11, 2002  (JP) ............................. 2002-266094

(51) Int. Cl.
   *G03B 27/42*   (2006.01)
   *G02B 5/08*    (2006.01)
(52) U.S. Cl. ..................................... 355/53; 359/849
(58) Field of Classification Search .................. 355/53, 355/67–71, 30; 359/811, 819, 820, 8, 849; 378/34, 35
See application file for complete search history.

(56) References Cited

U.S. PATENT DOCUMENTS

| | | | |
|---|---|---|---|
| 5,448,612 A | 9/1995 | Kasumi et al. | |
| 5,505,422 A | 4/1996 | Elterman | ..................... 248/476 |
| 5,572,563 A * | 11/1996 | Kasumi et al. | ................ 378/34 |
| 6,504,903 B1 * | 1/2003 | Kondo et al. | ................ 378/119 |

FOREIGN PATENT DOCUMENTS

| | | |
|---|---|---|
| DE | 40 07 622 | 9/1991 |
| DE | 4007622 | 9/1991 |
| JP | 5-100096 | 4/1993 |
| JP | 7-174896 | 7/1995 |
| JP | 7174896 | 7/1995 |
| JP | 7333483 | 12/1995 |
| JP | 2000-137182 | 5/2000 |
| JP | 2000-349009 | 12/2000 |

* cited by examiner

*Primary Examiner*—Henry Hung Nguyen
(74) *Attorney, Agent, or Firm*—Morgan & Finnegan, L.L.P.

(57) ABSTRACT

A mirror retainer for retaining a mirror accommodated in a chamber that has a wall and a lid openably provided on the wall, and generates a reduced pressure environment, includes an elastic member for connecting the mirror elastically to the lid.

19 Claims, 10 Drawing Sheets

APPARATUS AND METHOD FOR RETAINING MIRROR, AND MIRROR EXCHANGE METHOD

This application claims a benefit of foreign priority based on Japanese Patent Application No. 2002-266094, filed on Sep. 11, 2002, which is hereby incorporated by reference herein in its entirety as if fully set forth herein.

BACKGROUND OF THE INVENTION

The present invention relates generally to optical systems and exposure apparatuses, and more particularly to a method and apparatus for retaining a mirror used in an exposure apparatus. The present invention is suitable, for example, for an illumination optical system and projection exposure apparatus using an extreme ultraviolet ("EUV") region having a wavelength of 200 nm to 10 nm or an X-ray region.

Reduction projection exposures using ultraviolet have been conventionally employed to manufacture such a fine semiconductor device as a semiconductor memory and a logic circuit in photolithography technology. The critical dimension to be transferred by the reduction projection exposure is proportionate to a wavelength of light used for transfer, and inversely proportionate to the numerical aperture ("NA") of a projection optical system. In order to transfer a finer circuit pattern, a shorter wavelength of used ultraviolet ("UV") light has been promoted from an ultra-high pressure mercury lamp i-line with a wavelength of about 365 nm to KrF excimer laser with a wavelength of about 248 nm and ArF excimer laser with a wavelength of about 193 nm.

However, the lithography using the UV light has the limit to satisfy rapidly promoting fine processing of a semiconductor device, and a reduction projection exposure apparatus using EUV light with a wavelength of about 10 to 15 nm much shorter than that of the ultraviolet has been developed to efficiently transfer a very fine circuit pattern of 0.1 $\mu$m or less.

The EUV light source uses, for example, a laser plasma light source. The laser plasma light source irradiates a highly intensified pulse laser beam to a target in a vacuum chamber, and generates high-temperature plasma, emitting EUV light with a wavelength of about 13 nm. The target uses a metallic thin film, inert gas, droplet, etc., and is supplied to the vacuum chamber by such means as a gas jet. In order to raise an average intensity of the emitted EUV light, the pulse laser preferably has a higher repetitive frequency, and is usually driven by the repetitive frequency of several kHz.

Absorption in an object of EUV light region is so large that a deflection optical system that uses a lens may lower throughput, while it is usually used for visual light and UV light. Therefore, exposure apparatuses that use EUV light usually include a cataoptric optical system. For example, isotropically emitted EUV light from the laser plasma is then condensed by a first condenser mirror in an illumination optical system, and emitted to the next mirror to illuminate a mask.

The laser plasma light source generates not only the EUV light, but also flying particles called debris, which causes contamination, damages and lowered reflectance of an optical element. While some methods have been disclosed, for example, in Japanese Patent Application Publication No. 2000-349009, which prevent debris from reaching an optical element from the target, there has not been proposed a method for effectively preventing debris from reaching the first stage mirror, particularly close to the target, in the illumination optical system. As a result, the debris adheres to a surface on the first mirror and lowers its reflectance over exposure time. The first mirror should thus be replaced regularly when the reflectance lowers down to a certain level. A method for facilitating an exchange and maintenance of the mirror has been proposed, for example, in Japanese Patent Applications Publications Nos. 5-100096 and 7-174896 (corresponding to U.S. Pat. Nos. 5,448,612 and 5,572,563).

Figure 9:
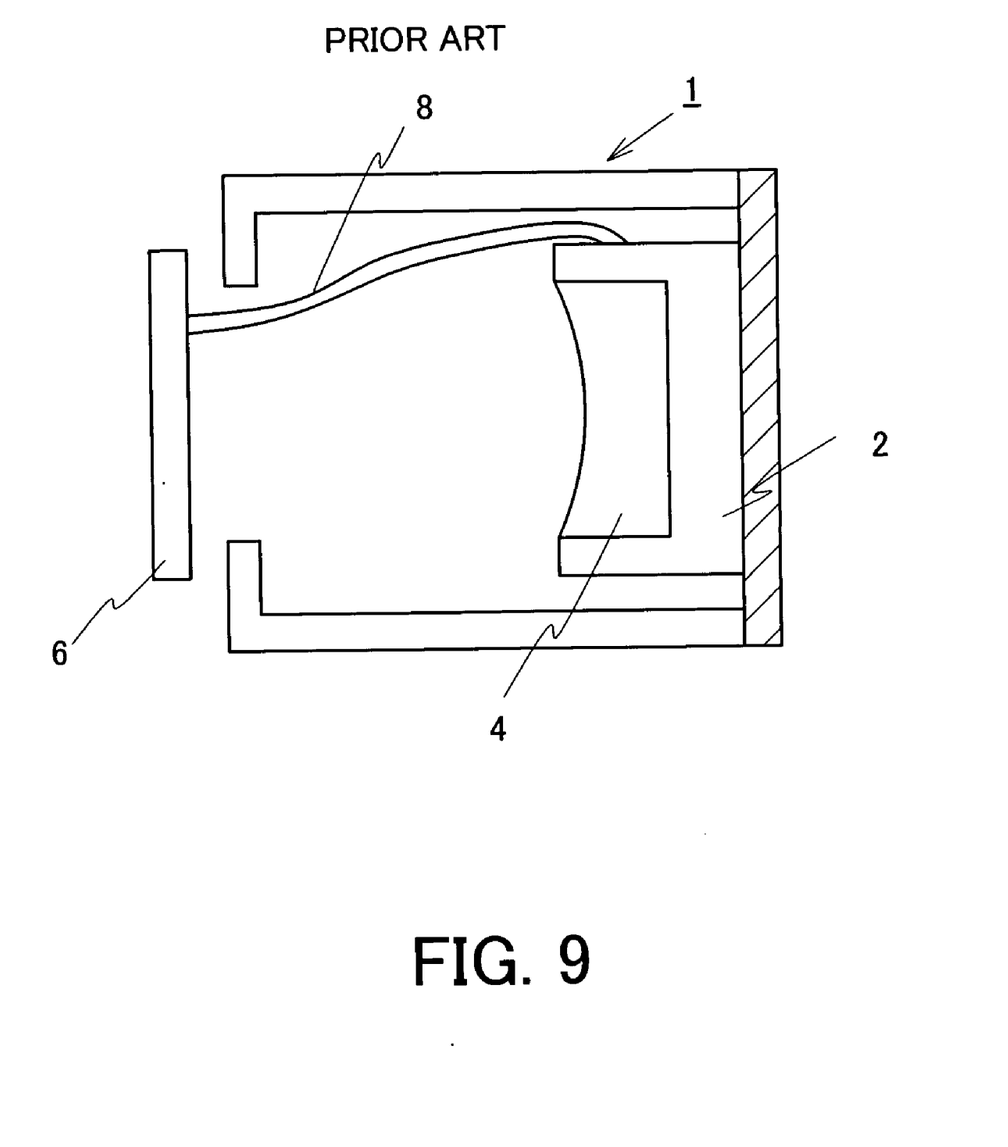
FIG. 9 is a schematic sectional view for explaining a conventional mirror retaining mechanism.
Figure 10:
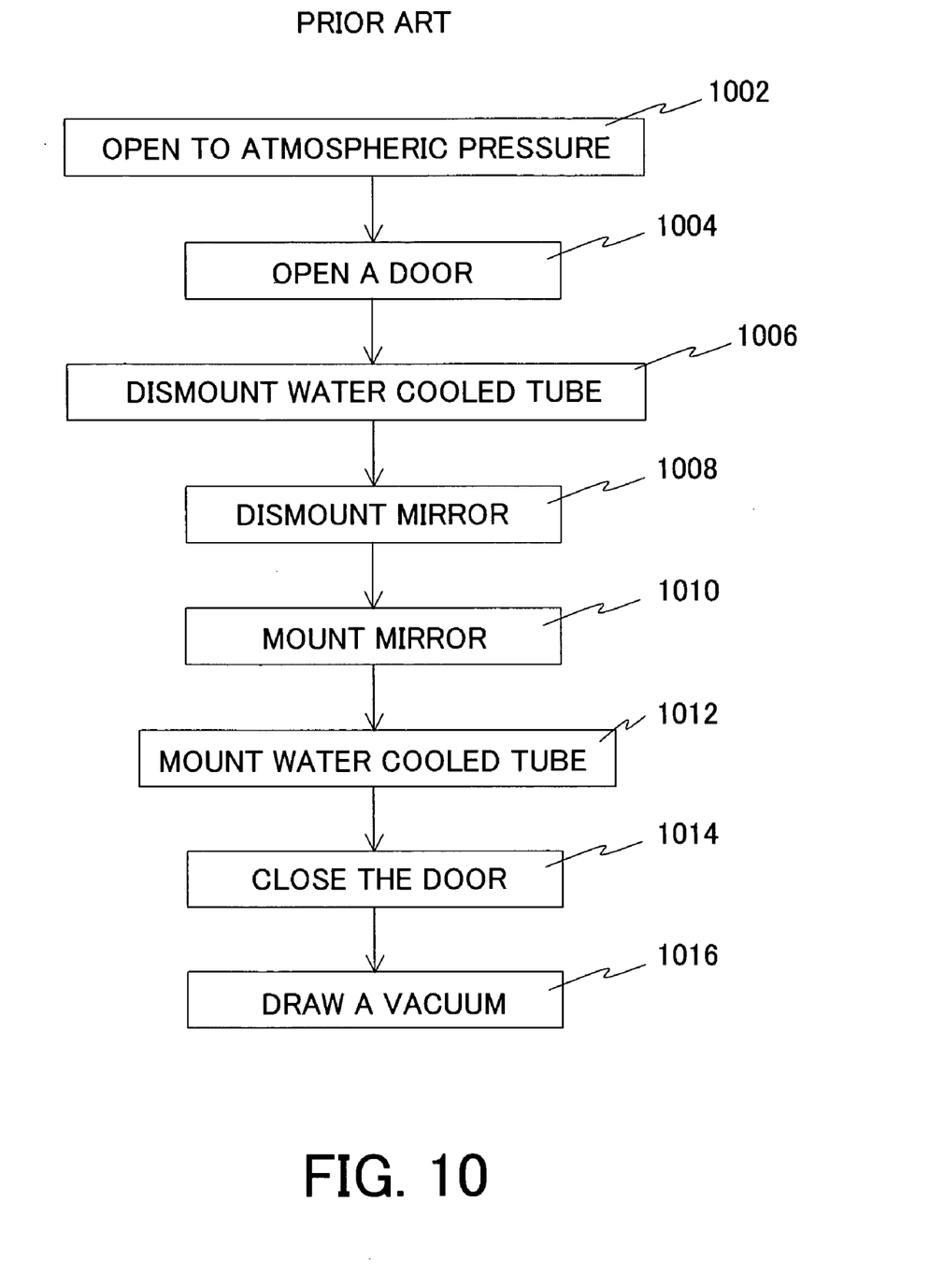
FIG. 10 is a flowchart showing a conventional method for exchanging a mirror shown in FIG. 9.

A description will be given of a conventional mirror replacement method proposed in Japanese Patent Application Publication No. 5-100096, with reference to FIGS. 9 and 10. Here, FIG. 9 is a schematic partial section of a vacuum chamber that accommodates an illumination system of an exposure apparatus. FIG. 10 is a flowchart for explaining a conventional mirror replacement method. A first mirror 4 is retained by a mirror holder 2 fixed in a vacuum chamber 1 that accommodates an illumination system of an exposure apparatus. The vacuum chamber 1 has an openable door 6. A water cooled tube 8 is connected to a mirror holder 2 and cools it. The water cooled tube 8 is connected to the door 6, and receives cooling water from the outside of the door 6.

In exchanging the mirror 4, the vacuum chamber 1 is returned to the atmospheric pressure (step 1002), the door 6 is opened (step 1004), and the water cooled tube 8 is dismounted from the door 6 (step 1006). Then, a hand is inserted from the door 6, and the mirror 4 is dismounted from the mirror holder 2 (step 1008), a new mirror 4 is mounted onto the mirror holder 2 (step 1010) and its reflective surface is optically and mechanically positioned (step 1012). Then, the water cooled tube 8 is attached to the door 6 (step 1012), and the door 6 is shut (step 1014), followed by the step of drawing a vacuum (step 1016). Thus, the conventional exchange of the mirror 4 requires a large maintenance space in the exposure apparatus and a long maintenance time, disadvantageously lowering exposure throughput and contaminating mirrors, such as an illumination optical system, and the chamber 1 due to a long opening time of the vacuum chamber 1.

Japanese Patent Application Publication No. 7-174896 discloses a mirror retaining method that uses part of a mirror for a partition of the vacuum chamber. This method may shorten an exchange time, because when the mirror is attached to a vacuum chamber, a mirror itself is simultaneously positioned. However, actually, the vacuum chamber is likely to deform and the mirror also undesirably deforms along with a deformation of a wall surface of the vacuum chamber after the mirror is positioned by attaching it to the chamber.

BRIEF SUMMARY OF THE INVENTION

Accordingly, it is an exemplary object of the present invention to provide a mirror retainer, a mirror retaining method, a mirror exchange method, an exposure apparatus having the mirror retainer, and a device fabrication method that utilizes this exposure apparatus, which may facilitate an exchange of a mirror in an illumination optical system, maintain initial positioning accuracy, and shorten an exchange time.

A mirror retainer of one aspect according to the present invention for retaining a mirror accommodated in a chamber that has a wall and a lid openably provided on the wall, and generates a reduced pressure environment includes an elastic member for connecting the mirror elastically to the lid.

The mirror retainer may further include a cooling plate, connected to the mirror between the lid and the mirror, for cooling the mirror. The mirror retainer may further include a cooling tube, located between the lid and the mirror, for providing coolant to the cooling plate via the lid. The elastic member may be connected to the cooling plate and the mirror via the cooling plate.

The mirror retainer may further include a positioning mechanism for positioning the mirror so as to restrict six axes of the mirror. The positioning mechanism may include three first fixing shafts connected to the mirror, and three second fixing shafts engaged with the first fixing shafts and provided in the chamber, wherein one of the three first fixing shafts and the three second fixing shafts have a spherical tip, and the other have a V-shaped groove tip, a cone groove tip, and a flat tip. The mirror retainer may further include a cooling plate, connected to the mirror located between the lid and the mirror, for cooling the mirror, wherein the positioning mechanism may include three first fixing shafts connected to the cooling plate and the mirror via the cooling plate, and three second fixing shafts engaged with the first fixing shafts and provided in the chamber, wherein one of the three first fixing shafts and the three second fixing shafts have a spherical tip, and the other have a V-shaped groove tip, a cone groove tip, and a flat tip.

A method of another aspect according to the present invention for retaining a mirror accommodated in a chamber that has a wall and a lid openably provided on the wall, and generates a reduced pressure environment, includes the steps of connecting the mirror elastically and exchangeably to the lid, and positioning the mirror by keeping the mirror in contact with a fixing member provided in the chamber independent to the chamber.

A method of another aspect according to the present invention for exchanging a mirror accommodated in a chamber that has a wall and a lid openably provided on the wall, and generates a reduced pressure environment, the method using a mirror retainer that includes an elastic member for connecting the mirror elastically to the lid, and a positioning mechanism, provided in the chamber, for positioning the mirror includes the steps of opening the chamber to atmospheric pressure, taking the mirror out of the chamber simultaneous with opening of the lid opens, exchanging the mirror, closing the lid simultaneous with introducing of the mirror into the chamber and positioning the mirror using the positioning mechanism, and drawing a vacuum in the chamber.

An illumination apparatus of another aspect according to the present invention for illuminating a mask that forms a pattern, the illumination apparatus being used for a chamber that has a wall and a lid openably provided on the wall, and generates a reduced pressure environment, includes a mirror, accommodated in the chamber and provided near an emission point of a light source for generating light from the plasma, for condensing the light, and an elastic member that connects the mirror elastically to the lid. The light may be the EUV light or x-ray.

An exposure apparatus of still another aspect according to the present invention includes a chamber that has a wall and a lid openably provided on the wall, and generates a reduced pressure environment, the above illumination apparatus for illuminating a mask that forms a pattern, and a projection optical system for projecting the pattern onto an object to be exposed.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 5:
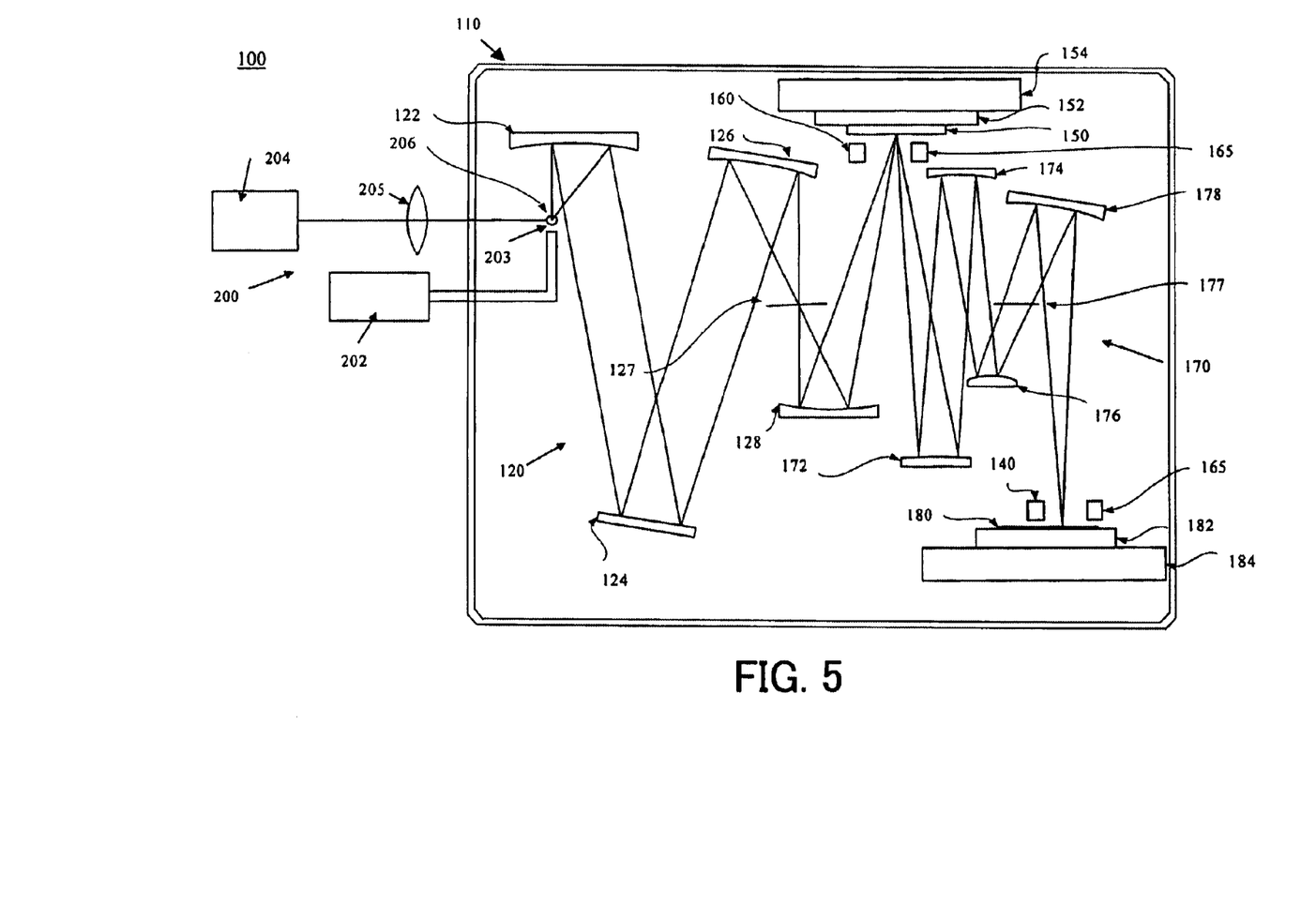
FIG. 5 is a schematic plane view of an exposure apparatus according to the present invention.

A description will now be given of an exemplary exposure apparatus 100 of one embodiment according to the present invention, with reference to accompanying drawings. In each figure, the same reference numeral denotes the same element. FIG. 5 is a schematic plane view of the exposure apparatus 100. The exposure apparatus 100 is an exposure apparatus that uses EUV light (e.g., with a wavelength of 13.4 nm) as exposure light for step-and-scan exposure.

Figure 1:
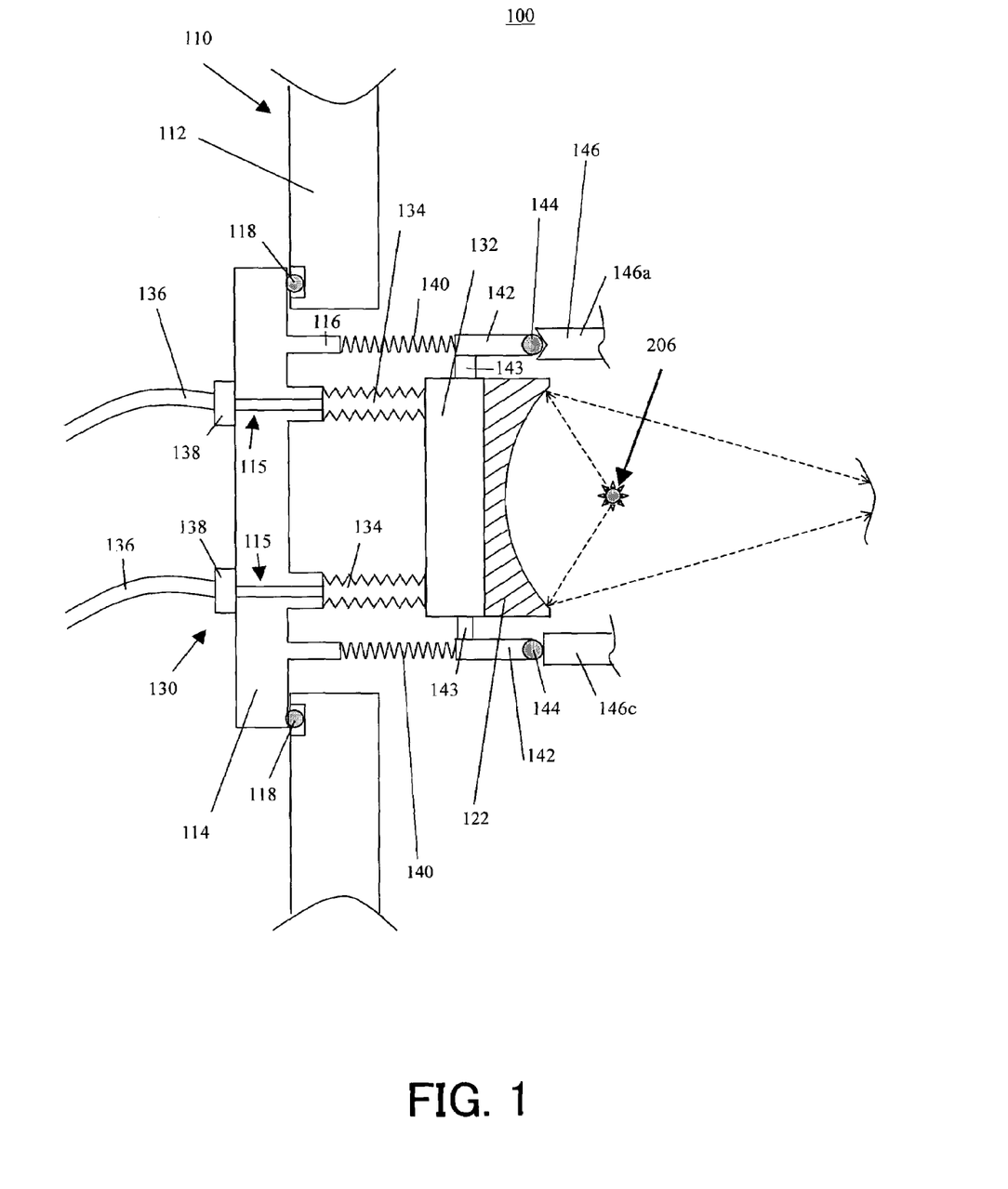
FIG. 1 is a schematic sectional view showing a mirror retaining and exchanging mechanism of a first embodiment according to the present invention.

Referring to FIG. 1, the exposure apparatus includes a vacuum chamber 110, an illumination optical system 120, a catoptric reticle or mask 150, an alignment optical system 160, a projection optical system 170, a reticle stage 154, a wafer stage 184, an EUV light source 200, and accommodates the illumination optical system 120 to the wafer stage 180 in the vacuum chamber 110.

The EUV light source 200 uses, for example, a laser plasma light source. The laser plasma light source irradiates a highly intensified pulse laser beam from pulsed laser 204 through a condenser lens 205 to a target 203 supplied by a target supply unit 202 accommodated in a vacuum chamber 110, thus generating high-temperature plasma 206 for use as EUV light with a wavelength of about 13 nm emitted from this. The target 203 uses a metallic thin film, inert gas, droplet, etc., and is supplied to the vacuum chamber 110 by the target supply unit 202 such as a gas jet. In order to raise an average intensity of the emitted EUV light, the pulsed laser 204 preferably has a higher repetitive frequency, and is usually driven by the repetitive frequency of several kHz. Alternatively, a discharge plasma light source is used, which discharges gas around an electrode arranged in the vacuum chamber 110, applies pulsed voltage at the electrode to create discharge, and generates high-temperature plasma 206, from which the EUV light is emitted, for example, with a wavelength of about 13 nm.

The illumination optical system 120 propagates the EUV light, and illuminates the mask (reticle) 150. The illumination optical system 120 includes first to third mirrors 122, 126 and 128, an optical integrator 124, and an aperture 127. The first mirror 122 collects approximately isotropically emitted EUV light. The multilayer film is made of alternately layered, two types of materials having different optical constants, such as molybdenum (Mo) and silicone (Si). For example, a Mo layer has a thickness of about 2 nm, and a Si layer has a thickness of about 5 nm. The number of layers is about 20 pairs. An addition of two thicknesses of two types of materials is referred to as a film period. In the above example, the film period is 2 nm+5 nm=7 nm. The multilayer film 112 that includes layered 20 pairs exhibits reflectance close to 70% in the EUV area, each pair having a film thickness of about 7 nm. A method for retaining and exchanging this mirror is applied to an exchange of this mirror. The optical integrator 124 serves to evenly illuminate the reticle 150 with a predetermined NA. The aperture 127 is provided at a position conjugate with the reticle 150 in the illumination optical system 120, and limits an area to illuminate the reticle 150 to an arc shape.

Figure 2:
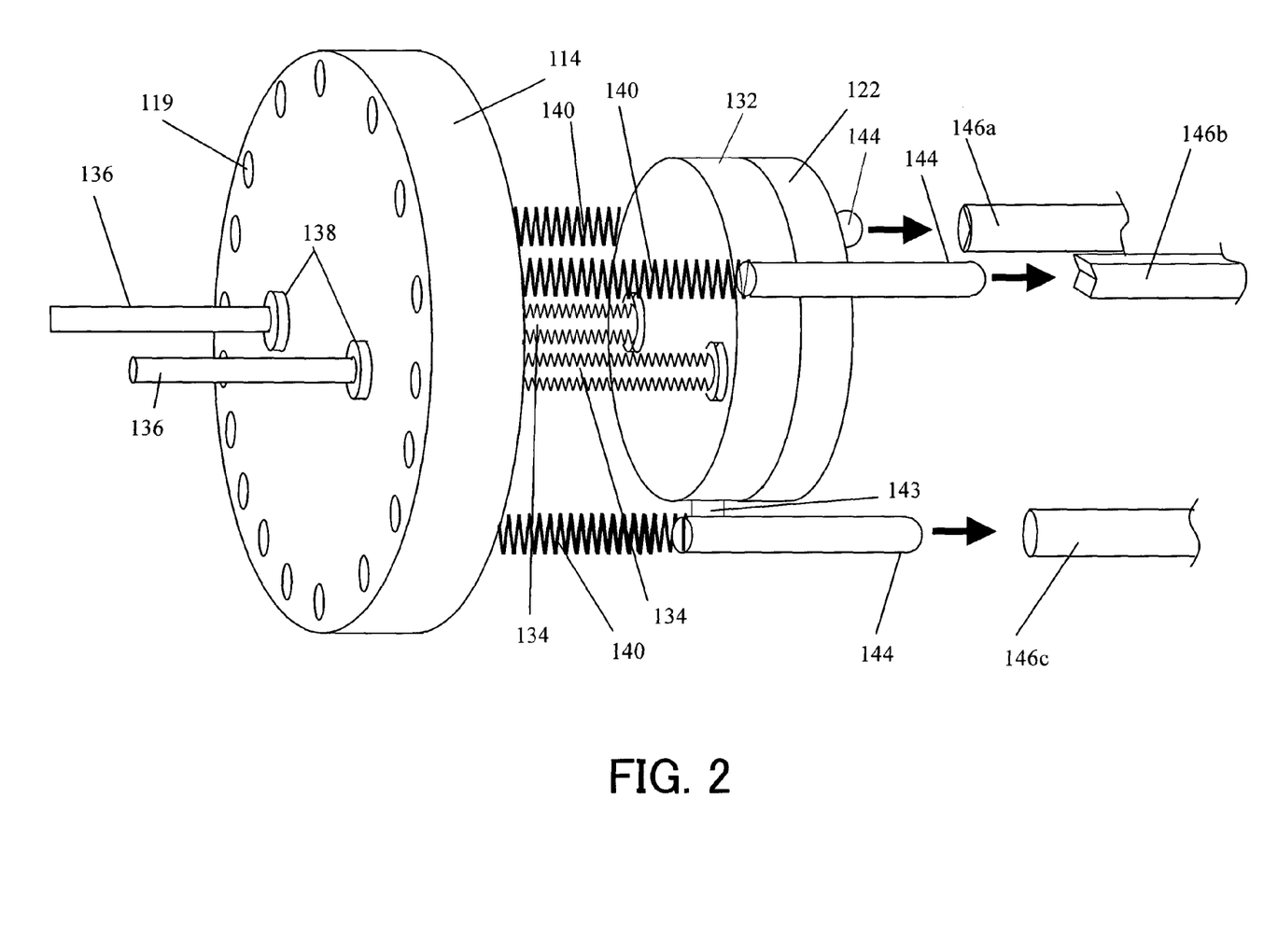
FIG. 2 is a schematic perspective view of the mirror retaining and exchanging mechanism shown in FIG. 1.

A retention and exchange mechanism of the mirror 122 includes, as shown in FIGS. 1 and 2, a flange 114 provided on a wall 112 of the vacuum chamber 110 so that the flange 114 may open and close, a cooling mechanism 130 for the mirror 122, an elastic column 140, a fixing shaft 142, and a kinematic mount 146. Here, FIGS. 1 and 2 are schematic sectional and perspective views for explaining the retention and exchange mechanism for the mirror 122.

The flange 114 serves as a lid, door, gate or partition provided on the wall 112 of vacuum chamber 110, and sealed by an O-ring 118 when it is closed. The O-ring 118 may maintain the atmosphere in the vacuum chamber 110 airtight. A metal ring or conflate would be used for higher vacuum.

The cooling mechanism 130 includes a cooling plate 132, a pair of water cooled tubes 134, a pair of water cooled tubes 136, and a seal 138. The cooling plate 132 is adhered to the mirror 122, and cools the mirror 122 using heat conduction. Coolant, e.g., cooling water is supplied to the cooling plate 132 by water cooled tubes 134 and 136. The water cooled tubes 134 and 136 are connected to a channel 115 in the flange 114. Cold water is supplied from one of the water cooled tubes 134 and 136, and drained from the other through the cooling water 132. For instance, cold water is supplied from the upper water cooled tubes 134 and 136, and drained from the lower water cooled tubes 134 and 136. The water cooled tube is formed as a flexible tube compatible with high vacuum to be flexible to movements to some extent. A channel for coolant formed in the cooling plate 132 may use any shape known in the art, and a detailed description will be omitted.

The cooling plate 132 and water cooled tubes 134 are provided between the mirror 122 and flange 114, and may be introduced into and taken out of the vacuum chamber 110 with the mirror 122 when the flange 114 opens and closes. It is convenient that the mirror 122 is made replaceable without dismounting the water cooled tubes 134.

The flange 114 is connected to a pair of elastic column 140 through a pair of projections 116. The elastic column 140 elastically supports the mirror 122 via the fixing shaft 142. The elastic column 140 is made of a coil spring in the instant embodiment, which supports weights of the mirror 122 and cooling plate 132 and forces them toward a light source direction. Alternatively, the elastic column 140 may use a spring, other than a coil spring, which applies a compression force in the light source direction, and a vacuum-compatible direct acting cylinder. Although the instant embodiment couples the elastic column 140 to the mirror 122 via the cooling plate 132 connected to the mirror 122, the elastic column 140 may be directly coupled to the mirror 122 as in another embodiment which will be described later with reference to FIGS. 3 and 4. Since the elastic column 140 couples the flange 114 to the mirror 122, the mirror 122 is taken out of the vacuum chamber 110 when the flange 114 opens and introduced into the vacuum chamber 110 when the flange 114 closes. Advantageously, one action serves as plural functions, and shortens an exchange time. In addition, the elastic column 140 enables the mirror 122 to be softly positioned.

Three fixing shafts 142 each having a hemispheric tip 144 are fixed onto the cooling plate 132 through three connection parts 143. Three members 142 to 144 have the same shape and arranged at an interval of 120° around the cooling plate 132. Irrespective of the same shape, tip shapes of the members 146 that are engaged with them are different, as distinguished in FIG. 2. The members 142 to 144 are positioned relative to the mirror 122 so as to provide joints that maintain distances from the spherical tips 144 to the mirror 122 surface and relative arrangement among them. While these joints that maintain distances and arrangement require a special jig, these joints reproduce positions without specific optical adjustments in exchanging a mirror, and improve workability.

The kinematic mounts 146 include three cylindrical members 156a to 146c having different shaped tips. Referring to FIG. 2, the member 146a has a cone groove tip, the member 146b has a sectionally V-shaped tip, and the member 146c has a flat shaped tip. The members 146a to 146c restrain the fixing shafts 142 so that the member 146a restrains three axes, the member 146b restrains two axes, and the member 146c restrains one axis. Thus, the members 146a to 146c restrain the fixing shafts 142 having hemispherical tips 144 with respect to six axes, and positions the fixing shafts 142. When the fixing shafts 142 are brought into contact with the kinematic mounts 146, the mirror 122 is fixed more easily and quickly than fixed by other fixing means, such as a bolt.

If necessary, known debris removing means may be provided between the light source 206 and the mirror 122. In an alternate embodiment, a laser plasma method that forms a metal target, such as Cu, into a tape shape, and feeds the tape by a reel to use a new surface. The light source 200 may use a discharge method, such as Z pinch method, a plasma focus, a capillary discharge, and hollow cathode triggered Z pinch.

Figure 3:
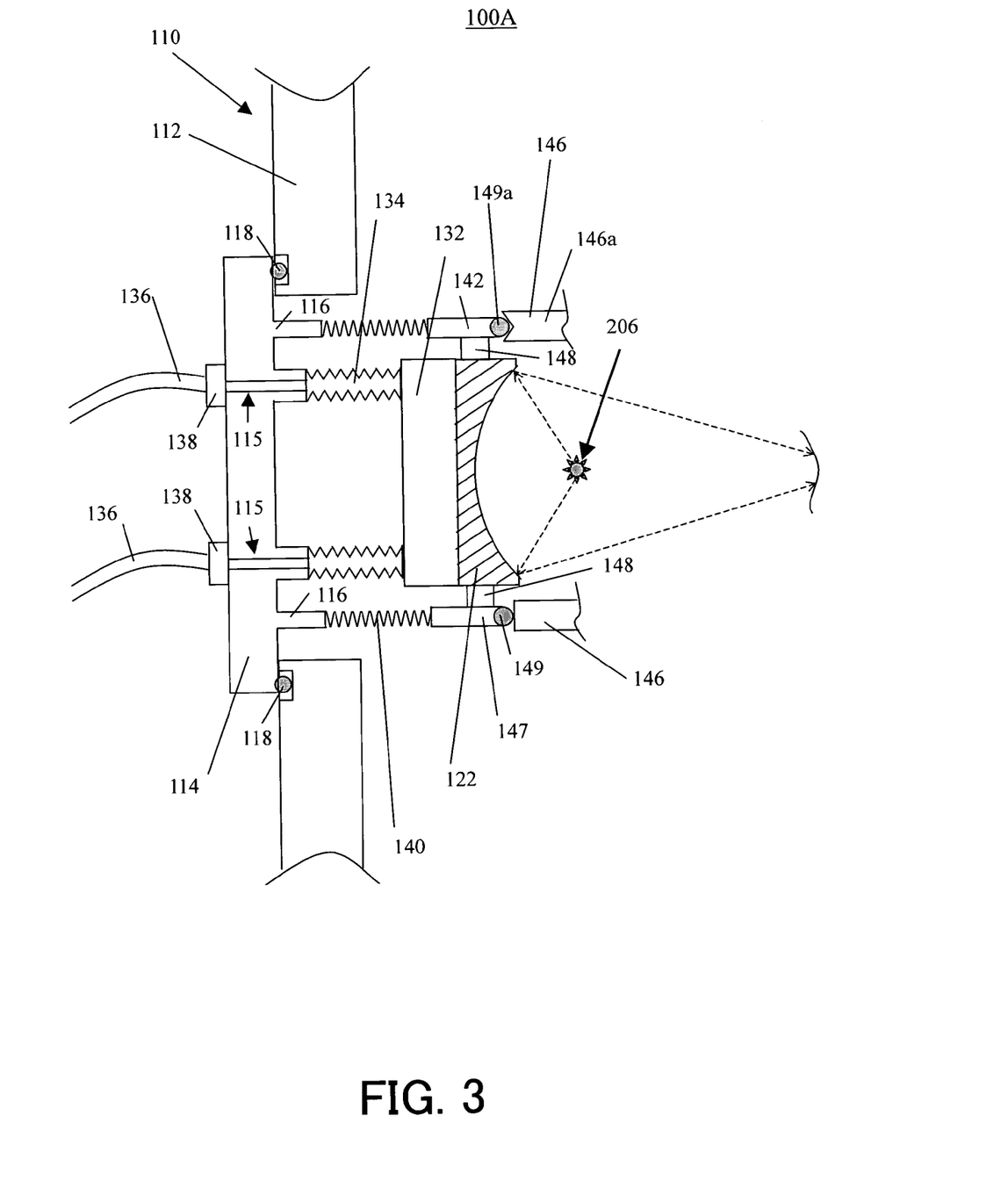
FIG. 3 is a schematic sectional view showing a mirror retaining and exchanging mechanism of a second embodiment according to the present invention.
Figure 4:
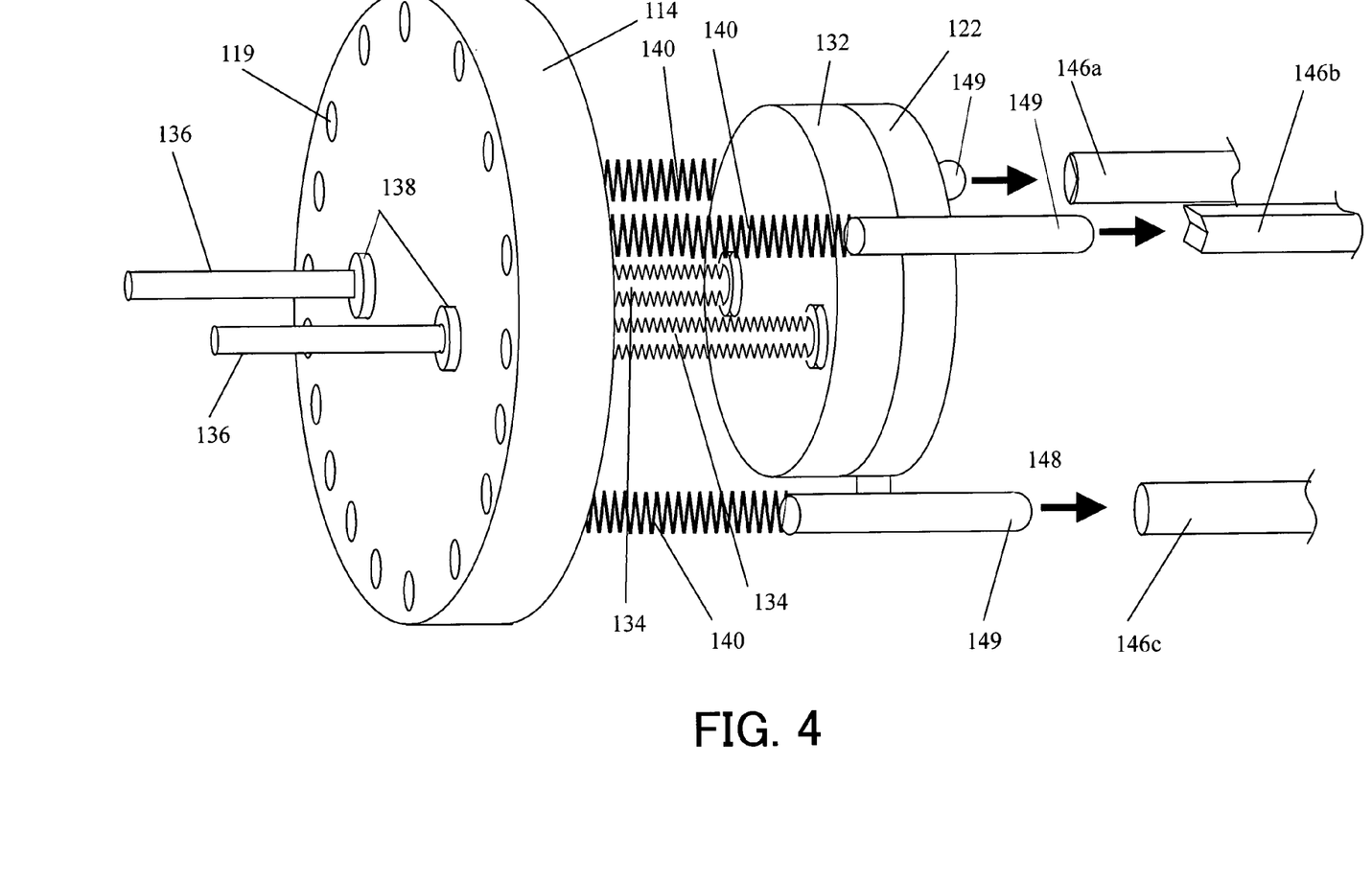
FIG. 4 is a schematic perspective view of the mirror retaining and exchanging mechanism shown in FIG. 3.

FIGS. 3 and 4 show a variation of FIGS. 1 and 2. Here, FIGS. 3 and 4 are schematic sectional and perspective views for explaining another retention and exchange mechanism of the mirror 122. According to the retention and exchange mechanism of the instant embodiment, the connection parts 143 are replaced with connection parts 148 connected to the mirror 122. Fixing shafts 147 correspond to fixing shafts 142, and tips 149 correspond to the tips 144. This configuration may relatively easily maintain distances and arrangement from the hemispherical tips 149 of the three shafts 147 to the mirror 122 surface, and improve precision by dispensing with the cooling plate 132. Although FIGS. 3 and 4 show the cooling plate 132, the cooling plate 132 may be omitted when a heat problem is solved. Thus, the inventive effects of facilitating an exchange and retention of the mirror 122 may be maintained even when the connection parts 148 are coupled to the mirror 122.

The projection optical system 170 includes a projection system first mirror 172, a projection system second mirror 174, a projection system third mirror 176, and a projection system fourth mirror 178, and images a pattern on a wafer surface. While the use efficiency of the EUV light improves as the number of mirrors reduces, a correction to aberration becomes difficult. The number of mirrors necessary to correct aberration is from about four to about six. The mirror has a convex or concave spherical or aspheric reflective surface. NA is about 0.1 to about 0.2. The mirror is formed by polishing and grinding a plate made of a material having high rigidity and hardness and a small coefficient of thermal expansion, such as low-expansion glass and silicon carbide, and creating a predetermined reflective shape, and forming a multilayer, such as molybdenum/silicon, on its reflective surface.

The reticle stage 154 and the wafer stage 184 each include a mechanism for scanning synchronously at a speed ratio in proportion to a reduction ratio. Here, "X" is a scan direction in the reticle 1500 surface or the wafer 180 surface, "Y" is a direction perpendicular to "X", and "Z" is a direction perpendicular to the reticle 150 surface or the wafer 180 surface.

The reticle 150 forms a desired pattern and is held on a reticle chuck 152 on the reticle stage 154. The reticle stage 154 has a mechanism for moving in the direction X, and a fine adjustment mechanism in the directions X, Y, Z, and rotational directions around each axis for positioning the reticle 150. A position and orientation of the reticle stage 154 are measured by a laser interferometer, and controlled based on the measurement results.

The wafer 180 is held onto the wafer stage 184 by the wafer chuck 182. Similar to the reticle stage 154, the wafer stage 184 has a mechanism for moving in the direction X, and a fine adjustment mechanism in the directions X, Y, Z, and rotational directions around each axis for positioning the wafer 180. The position and orientation of the wafer stage 184 are measured by a laser interferometer, and controlled based on the measurement results.

The alignment detection optical system 160 measures a positional relationship between the position of the reticle 150 and the optical axis of the projection optical system 170, and a positional relationship between the position of the wafer 180 and the optical axis of the projection optical system 170, and sets positions and angles of the reticle stage 154 and the wafer stage 184 so that a projected image of the reticle 150 may be positioned in place on the wafer 180. A focus detection optical system 165 measures a focus position in the direction Z on the wafer 180 surface, and control over a position and angle of the wafer stage 184 may always maintain the wafer 180 surface at an imaging position of the projection optical system 170 during exposure.

Once a scan exposure finishes on the wafer 180, the wafer stage 184 moves stepwise in the directions X and Y to the next start position for scan exposure, and the reticle stage 154 and the wafer stage 184 synchronously scan in the direction X at a speed ratio in proportion to the reduction ratio of the projection optical system.

While the reduced, projected image of the reticle 150 is thus formed on the wafer 180, synchronously scanning between them is repeated (step-and-scan manner). As a result, a transferred pattern on the reticle 150 is transferred onto the whole area of the wafer 180.

In order to prevent gas from absorbing the EUV light, and to prevent those molecules including carbon which remain in the space that accommodates an optical element onto which the EUV light is irradiated, a space that propagates the EUV light and accommodates the optical element should be maintained at a certain reduced pressure. In other words, the light source, optical elements of illumination optical system 120 and projection optical system 170, reticle 150 and wafer 180 are accommodated in the vacuum chamber 110, which is exhausted to meet predetermined degree of vacuum.

Figure 6:
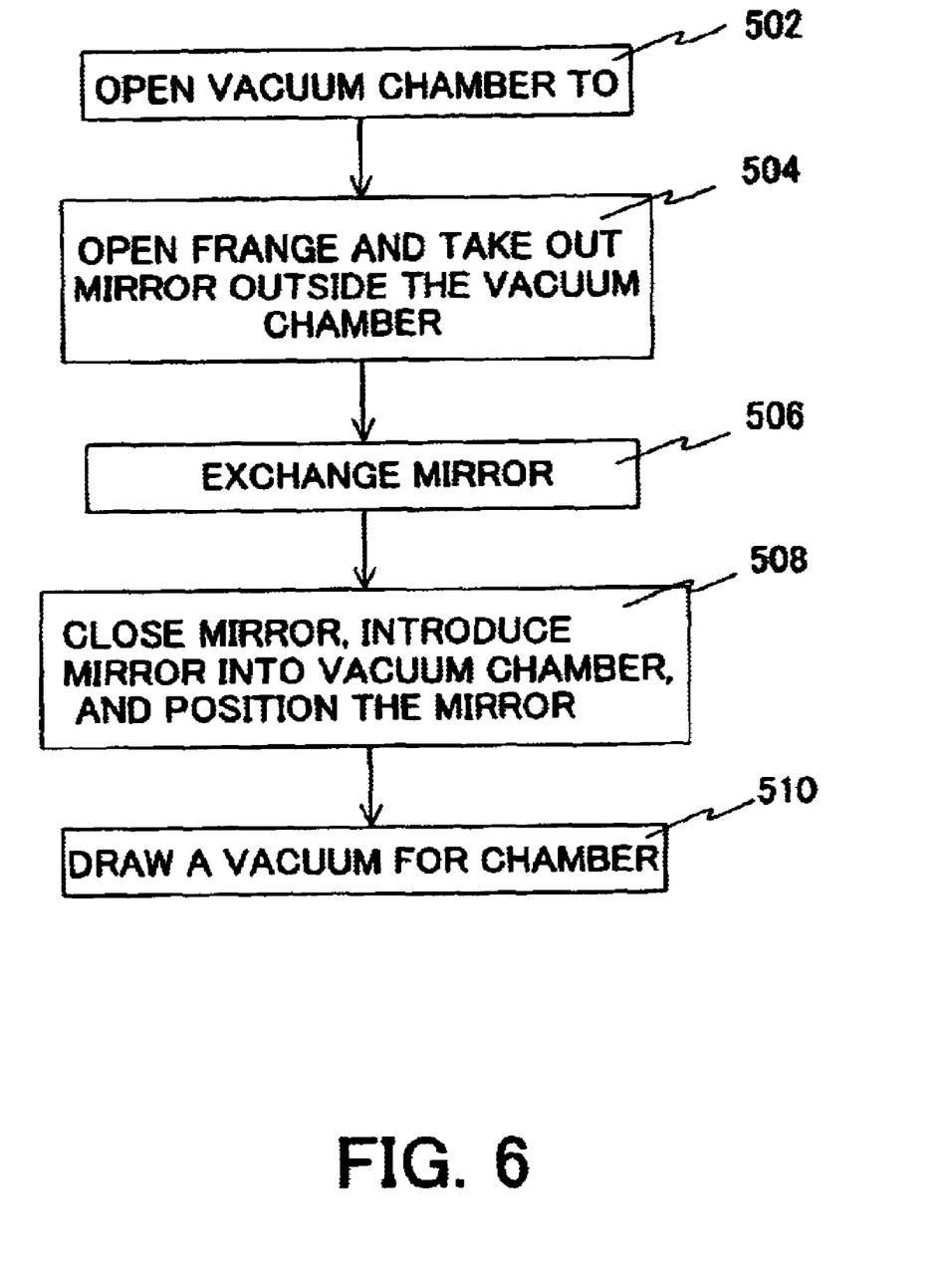
FIG. 6 is a flowchart showing an inventive method for exchanging a mirror.

A description will now be given of an inventive mirror exchange method. Here, FIG. 6 is a flowchart for explaining the inventive mirror exchange method. First, a vacuum chamber 110 is opened to the atmospheric pressure (step 502), and the mirror 122 is taken out of the chamber 110 simultaneous with opening of the flange 114 (step 504). Then, the mirror 122 is exchanged (step 506). Next follows closing of the flange 114 simultaneous with introduction of the mirror 122 into the vacuum chamber 110 and positioning using the above positioning mechanism (144 and 146 etc.) (step 508). The last step draws a vacuum in the vacuum chamber 110 (step 510). According to this method, the steps 504 and 508 serve as two or more actions, and enable an exchange of the mirror 122 to end in a shorter time than the conventional arrangement that performs these actions separately. While FIGS. 1 and 2 show a perpendicular structure, the present invention may achieve similar effects even in a horizontal arrangement.

Figure 7:
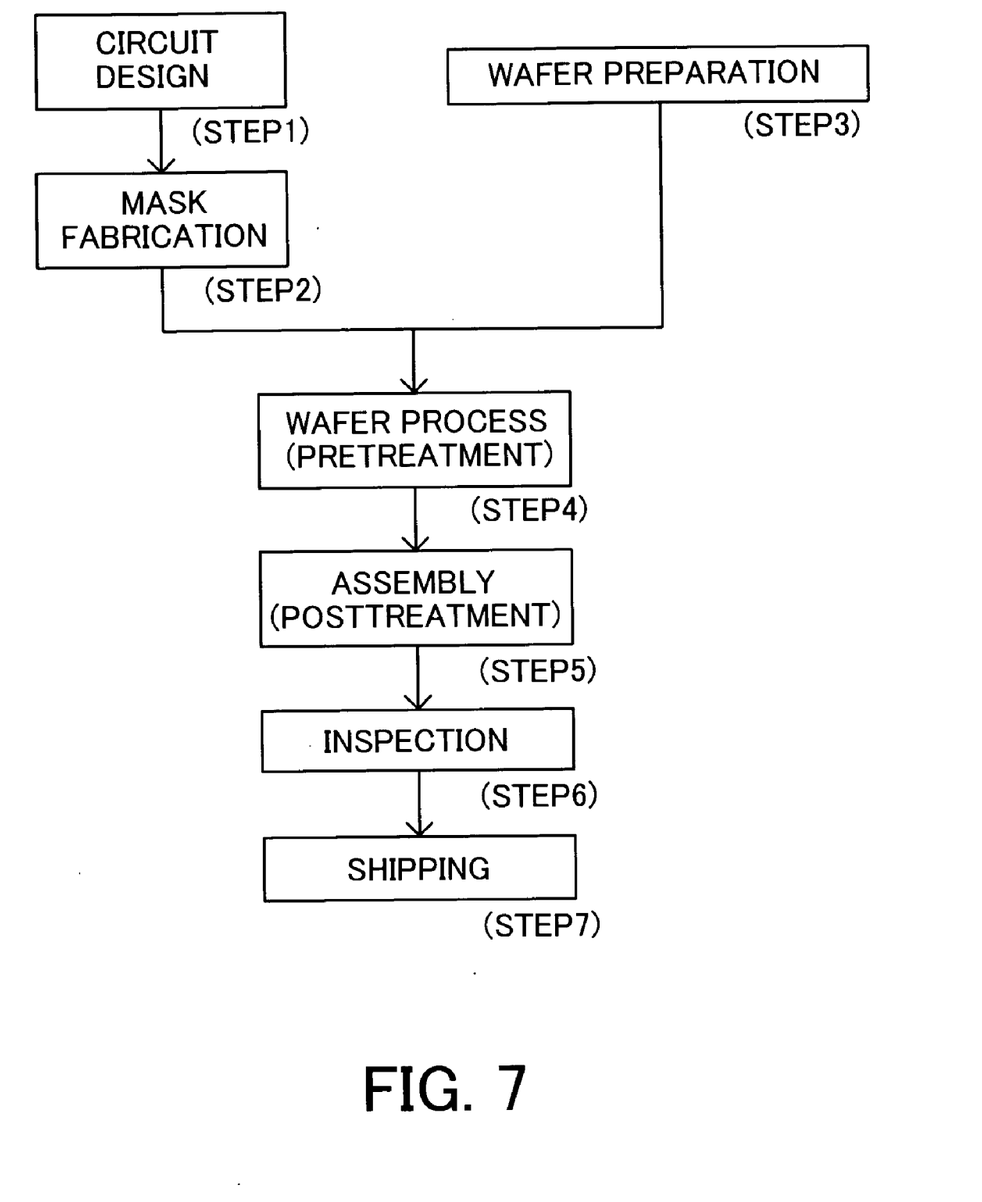
FIG. 7 is a flowchart for explaining how to fabricate devices (such as semiconductor chips such as ICs and LSIs, LCDs, CCDs, and the like).
Figure 8:
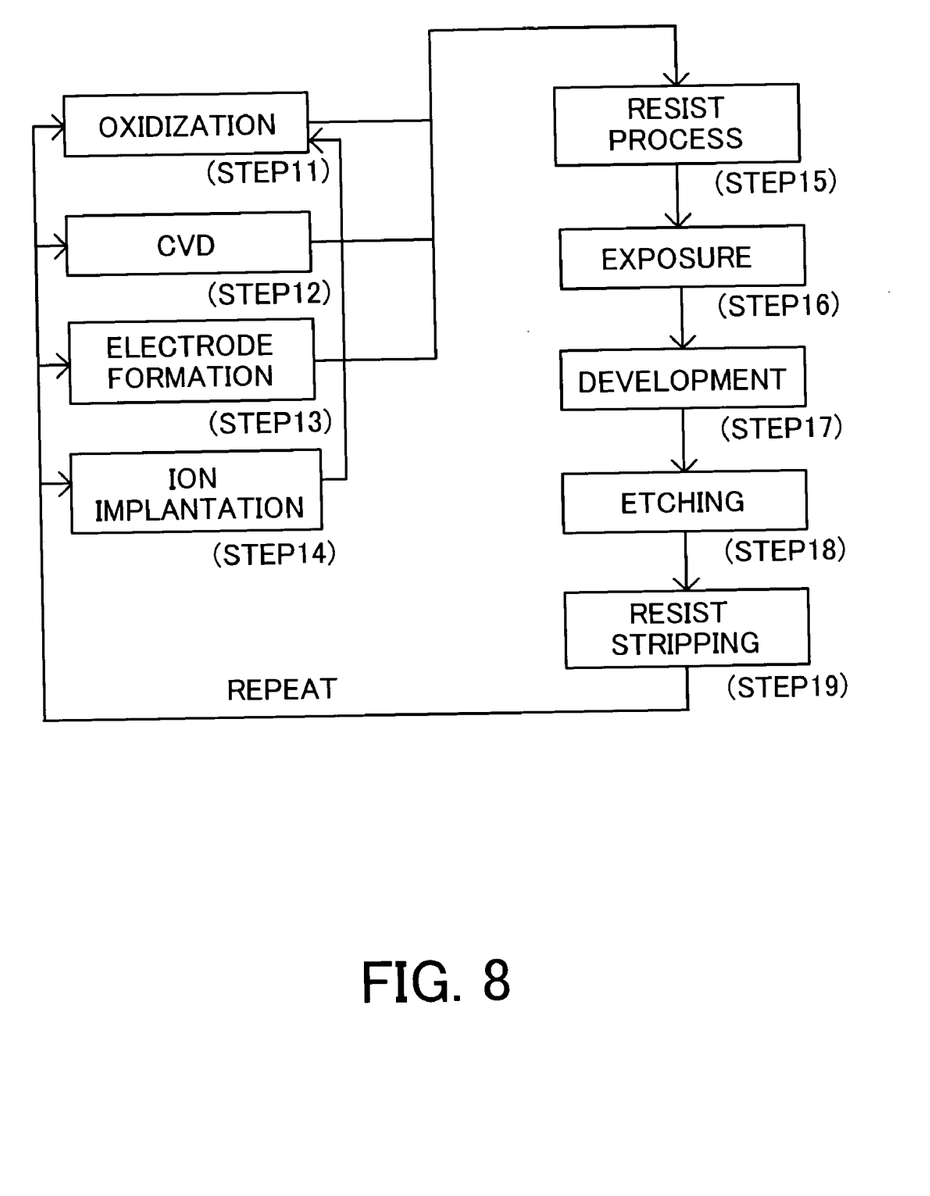
FIG. 8 is a flowchart for Step 4 that is a wafer process shown in FIG. 7.

Referring now to FIGS. 7 and 8, a description will be given of an embodiment of a device fabricating method using the above exposure apparatus. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4 in FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment neither spends a long time in exchange nor exposes the inside the vacuum chamber 110 to the atmospheric pressure for a long time. Therefore, the device fabrication method of this embodiment may manufacture, with desired throughput, a higher quality device than the conventional method.

Further, the present invention is not limited to these preferred embodiments, and various variations and modifications may be made without departing from the scope of the present invention. For example, the first mirror 122 is not limited to one mirror system, but is applicable to plural mirrors for increase a concentration ratio of exposure light. The present invention may exhibit similar effects with similar structure for the plural mirrors.

As discussed, an exposure apparatus that uses a plasma light source according to the instant embodiment facilitates a quick exchange of a first mirror in a small space, and prevents a deformation of the mirror in positioning of the mirror by providing three shaft tips with (V-shaped, flat and cone) kinematic mount mechanism on a illumination system frame and avoiding excessive constraints of the mirror. Stable positioning of the first mirror to the same position in the illumination optical system may be quickened in a small space by maintaining a relationship the mirror surface and three spherical positions of the three shafts. Improved workability shortens an exchange time of the mirror, and improves throughput as a whole.

The water cooled tube for supplying coolant between the flange and the cooling pate is formed as a flexible tube. This configuration may reduce the restraint force applied by a tube to the mirror, save laborious piping in the vacuum chamber, and improves workability. This also remarkably shortens maintenance time, improves throughput as a whole, and miniaturizes the exposure apparatus due to the small maintenance space. A configuration that arranges three fixing shafts from the cooling plate directly onto the mirror would also provide similar effects and enable more precise positioning.

The present invention may provide a mirror retainer, a mirror retaining method, and a mirror exchange method, which may facilitate an exchange of a mirror in an illumination optical system, maintain initial positioning accuracy, and shorten an exchange time.

What is claimed is:

1. An illumination apparatus for illuminating a mask that has a pattern, said illumination apparatus comprising:
   a chamber for generating a reduced pressure environment;
   a mirror, located in the reduced pressure environment in said chamber, for condensing an EUV light from an emission point of the EUV light;
   a fixing shaft that is fixed onto the mirror;
   a lid that is openably provided on a wall of the chamber;
   an elastic member for connecting the lid with the mirror; and
   an element, accommodated in the chamber independently of from the chamber,
   wherein said elastic member presses the fixing shaft against the element, and positions six axes direction of the mirror.

2. An apparatus according to claim 1, further comprising a cooling plate, connected to the mirror and arranged between the lid and the mirror, for cooling the mirror.

3. An apparatus according to claim 2, wherein said elastic member is connected to said cooling plate and the mirror via said cooling plate.

4. An apparatus according to claim 2, wherein said fixing shaft includes three first fixing shafts connected to the mirror,
   wherein the element includes three second fixing shafts engaged with said first fixing shafts and provided in the chamber, and
   wherein one of the first and second fixing shafts has a spherical tip, and the other have a V-shaped groove tip, a cone groove tip, or a flat tip.

5. An apparatus according to claim 2, wherein said elastic member is connected to the lid and the cooling plate that is connected to the mirror.

6. An apparatus according to claim 2, wherein said elastic member is connected to the lid and the fixing shaft.

7. An apparatus according to claim 1, further comprising a cooling tube, located between the lid and the mirror, for providing coolant to said cooling plate via the lid.

8. An apparatus according to claim 1, wherein said elastic member is directly or indirectly connected to the mirror.

9. An exposure apparatus comprising:
   an illumination optical system for illuminating a mask that has a pattern using an EUV light from an emission point; and
   a projection optical system for projecting a light from the mask onto an object,
   wherein said illumination optical system includes:
   a chamber for generating a reduced pressure environment;
   a mirror, located in the reduced pressure environment in said chamber, for condensing the EUV light from the emission point;
   a fixing shaft that is fixed onto the mirror;
   a lid that is openably provided on a wall of the chamber;
   an elastic member for connecting the lid with the mirror; and
   an element, accommodated in the chamber independently of from the chamber,
   wherein said elastic member presses the fixing shaft against the element, and positions six axes direction of the mirror.

10. An apparatus according to claim 9, further comprising a cooling plate, connected to the mirror and arranged between the lid and the mirror, for cooling the mirror.

11. An apparatus according to claim 9, further comprising a cooling tube, located between the lid and the mirror, for providing coolant to said cooling plate via the lid.

12. An apparatus according to claim 9, wherein said elastic member is connected to said cooling plate and the mirror via said cooling plate.

13. An apparatus according to claim 9, wherein said elastic member is directly or indirectly connected to the mirror.

14. An apparatus according to claim 9, wherein said elastic member is connected to the lid and the cooling plate that is connected to the mirror.

15. An apparatus according to claim 9, wherein said elastic member is connected to the lid and the fixing shaft.

16. A device manufacturing method comprising steps of:
   exposing an object to an image of a pattern of a mask using an exposure apparatus as defined in claim 9; and
   developing the exposed object.

17. An exposure apparatus comprising:
   an illumination optical system for illuminating a mask that has a pattern using an EUV light from an emission point; and
   a projection optical system for projecting a light from the mask onto an object,
   wherein said illumination optical system includes:
   a chamber for generating a reduced pressure environment;
   a mirror, located in the reduced pressure environment in said chamber, for condensing the EUV light from the emission point;

a lid that is openably provided on a wall of the chamber; and an elastic member for connecting the lid with the mirror.

18. An apparatus according to claim 17, wherein said elastic member is directly or indirectly connected to the mirror.

19. A device manufacturing method comprising steps of: exposing an object to an image of a pattern of a mask using an exposure apparatus as defined in claim 17; and developing the exposed object.

* * * * *

UNITED STATES PATENT AND TRADEMARK OFFICE
CERTIFICATE OF CORRECTION

PATENT NO.       : 6,985,208 B2                                           Page 1 of 1
APPLICATION NO.  : 10/661870
DATED            : January 10, 2006
INVENTOR(S)      : Miyachi et al.

It is certified that error appears in the above-identified patent and that said Letters Patent is hereby corrected as shown below:

On the Title Page

In section (56), subsection, FOREIGN PATENT DOCUMENTS, delete the first occurrence of "DE  40 07 622  9/1991", and delete the first occurrence of "JP  7-174896  7/1995".

Signed and Sealed this

Twenty-first Day of November, 2006

JON W. DUDAS
*Director of the United States Patent and Trademark Office*